US008847275B2

(12) United States Patent
Jimenez et al.

(10) Patent No.: US 8,847,275 B2
(45) Date of Patent: Sep. 30, 2014

(54) ELECTRONIC DEVICE FOR PROTECTION AGAINST ELECTROSTATIC DISCHARGES, WITH A CONCENTRIC STRUCTURE

(71) Applicant: STMicroelectronics S.A., Montrouge (FR)

(72) Inventors: Jean Jimenez, Saint Theoffrey (FR); Philippe Galy, Le Touvet (FR); Boris Heitz, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/796,753

(22) Filed: Mar. 12, 2013

(65) Prior Publication Data

US 2014/0097464 A1 Apr. 10, 2014

(30) Foreign Application Priority Data

Mar. 12, 2012 (FR) .................... 12 52194

(51) Int. Cl.
| H01L 29/417 | (2006.01) |
| H01L 29/74 | (2006.01) |
| H01L 31/111 | (2006.01) |
| H01L 29/72 | (2006.01) |
| H01L 29/73 | (2006.01) |
| H01L 23/62 | (2006.01) |
| H01L 27/02 | (2006.01) |
| H01L 29/87 | (2006.01) |
| H01L 29/747 | (2006.01) |

(52) U.S. Cl.
CPC .......... *H01L 27/0259* (2013.01); *H01L 29/87* (2013.01); *H01L 29/7436* (2013.01); *H01L 27/0262* (2013.01); *H01L 29/747* (2013.01)

USPC .......... 257/119; 257/173; 257/174; 257/355; 257/356; 257/E29.12

(58) Field of Classification Search
USPC ............. 257/119, 173, 174, 355, 356, E29.12
See application file for complete search history.

(56) References Cited

U.S. PATENT DOCUMENTS

| 3,035,186 | A | * | 5/1962 | Doucette ...................... 327/427 |
| 3,210,560 | A | * | 10/1965 | Stehney ....................... 327/438 |
| 3,263,178 | A | * | 7/1966 | Nowalk ........................ 330/250 |
| 3,325,706 | A | * | 6/1967 | Kruper .......................... 257/579 |
| 3,935,587 | A | * | 1/1976 | Ostop et al. .................... 257/47 |
| 4,602,266 | A | * | 7/1986 | Coe ................................ 257/495 |
| 5,446,302 | A | * | 8/1995 | Beigel et al. .................. 257/355 |
| 5,552,625 | A | * | 9/1996 | Murakami et al. ............ 257/409 |
| 5,668,392 | A | * | 9/1997 | Huang et al. .................. 257/340 |
| 7,238,991 | B2 | * | 7/2007 | Kuroda et al. ................ 257/355 |
| 7,675,120 | B2 | * | 3/2010 | Sekiguchi et al. ............ 257/372 |
| 2004/0178474 | A1 | * | 9/2004 | Patti ............................. 257/557 |
| 2004/0251499 | A1 | * | 12/2004 | Yamaguchi et al. .......... 257/343 |

(Continued)

FOREIGN PATENT DOCUMENTS

| EP | 2 290 691 A1 | 3/2011 |
| WO | WO 2011/089179 A1 | 7/2011 |

*Primary Examiner* — Ida M Soward
(74) *Attorney, Agent, or Firm* — Slater & Matsil, L.L.P.

(57) ABSTRACT

The component incorporates, in topological terms, a scalable number of triac structures in a concentric annular arrangement. The component can be used with an electronic device to protect against electrostatic discharges. For example, the components can be used to protect the input/output pad, the first power supply terminal, and the second power supply terminal of an integrated circuit against electrostatic discharges.

20 Claims, 9 Drawing Sheets

(56) References Cited

U.S. PATENT DOCUMENTS

2009/0032837 A1  2/2009  Tseng et al.
2009/0212323 A1  8/2009  Liu et al.
2011/0042747 A1  2/2011  Galy et al.
2011/0204415 A1  8/2011  Van Wijmeersch et al.

* cited by examiner

Positive ESD pulse

Negative ESD pulse

US 8,847,275 B2

ELECTRONIC DEVICE FOR PROTECTION AGAINST ELECTROSTATIC DISCHARGES, WITH A CONCENTRIC STRUCTURE

This application claims priority to French Patent Application No. 1252194, which was filed Mar. 12, 2012 and is incorporated herein by reference.

TECHNICAL FIELD

The invention relates to integrated electronic components, and notably to those intended for the protection of nodes against electrostatic discharges (ESD).

BACKGROUND

An electronic module to be protected is connected between two power supply nodes and also, in some cases, to an input/output node intended to receive and deliver an input/output signal. For instance, when the module is in operation, one of the power supply nodes can be connected to a positive voltage and the other node can be connected to a negative or zero voltage (ground).

When the module is not operational, it may be subjected to an electrostatic discharge typically taking the form of a very brief current pulse (with a typical duration of several microseconds) between two of the nodes, with a maximum current of about 2 amperes, for example, and typically occurs after 10 nanoseconds. Typically, this corresponds, for example, to a pulsed potential difference applied between the two nodes through an equivalent RLC circuit, with a maximum voltage occurring after 10 nanoseconds and with an intensity of 1 to 4 kV HBM, for example 4 kV HBM for 2.5 amperes.

It should be noted at this point that the letters HBM are the abbreviation of the acronym "Human Body Model", well-known to skilled practitioners in the field of electrostatic discharge protection, and signifying, notably, an electrical circuit intended to model an electrostatic discharge delivered by a human being and normally used for testing the sensitivity of devices to electrostatic discharges. This HBM circuit, which is the equivalent RLC circuit mentioned above, and to which a high voltage is applied, includes, notably, a 100 pF capacitor which is discharged through a 1.5 kohm resistance into the device to be tested. Thus, in the present case, an electrostatic discharge of 4 kilovolts HBM signifies that a potential difference of 4 kilovolts is applied to the HBM circuit.

SUMMARY OF THE INVENTION

Thus it is desirable for this current pulse to flow through an ESD protection device instead of through the module to be protected.

The protection device is therefore intended to absorb this current pulse and prevent excess voltages across the terminals of the module.

Although MOS power transistors can be used as protection devices between the two power supply nodes, the general practice is to use two power diodes, connected, respectively, between the input/output node and the two power supply nodes, for the ESD protection of the input/output node.

The width of each diode is generally large, typically 150 microns, resulting in a considerable occupation of surface area on silicon.

Furthermore, these devices give rise to considerable parasitic capacitances, which have a negative effect on the integrity of the input/output signal.

In one embodiment, an integrated electronic component is proposed, for use in an ESD protection device in particular, this component having a completely novel topology, making its construction highly compact, and being scalable, while also being capable of absorbing large ESD pulses.

In particular, this results in a reduction of the surface area and a reduction of the parasitic capacitances.

In one embodiment, an integrated electronic component is proposed, the component including a scalable number of triggerable two-way power structures, such as triacs, arranged in a concentric annular topology.

According to one aspect, an integrated electronic component is proposed. The component comprises M concentric annular semiconductor tanks, each having a first type of conductivity, for example p-type conductivity, where M is greater than or equal to two. Two adjacent annular tanks are separated by an annular semiconductor layer having a second type of conductivity opposed to the first, for example n-type conductivity. Each of M annular semiconductor zones covers and contacts a respective one of the M annular tanks. Each annular semiconductor zone includes a sequence of R semiconductor regions in contact with each other, having the two types of conductivity alternately, and electrically coupled to each other so as to form a common annular electrode. These regions are advantageously more strongly doped than the underlying tanks and are therefore advantageously of n+ and p+ type alternately. R is an even number greater than or equal to two. Each semiconductor region of one of the annular zones faces a semiconductor region of an adjacent annular zone. Two facing regions each have a different one of the two types of conductivity. Two adjacent annular tanks separated by the annular layer and their two associated annular zones form R triggerable two-way structures, such as triac structures, having in parallel a single control electrode or common gate formed by the annular layer; and, additionally, a first terminal of the component is formed by at least a first annular electrode and a second terminal of the component is formed by at least a second annular electrode.

Thus, in one embodiment, the component incorporates, in topological terms, R(M−1) triac structures, and the number of triac structures can be changed by changing R and M. The component is therefore easily scalable.

In one embodiment, when M is greater than or equal to three, the component comprises at least one supplementary electrically conductive element, and at least one of the first and second terminals is formed by at least two annular electrodes interconnected by the at least one supplementary element.

In another embodiment, when M is greater than or equal to four, the component comprises a plurality of supplementary electrically conductive elements. The first terminal is formed by a plurality of first annular electrodes interconnected by at least a first supplementary element, while the second terminal is formed by a plurality of second annular electrodes interconnected by at least a second supplementary element.

Thus these embodiments offer increased scalability for the component. This is because annular electrodes can be interconnected in a number of ways, making it possible to choose the sectors of the component that are to dissipate the energy of an ESD pulse. It is therefore possible to produce components with higher or lower robustness to heat dissipation.

The component can further comprise a buried semiconductor layer having the second type of conductivity, such as n-type, and contacting all the annular semiconductor layers. This embodiment enables all the gates of all the triac structures to be connected topologically.

In one embodiment, the buried layer can emerge inside the central annular tank and an electrical contact area is provided on the emerging part of the buried layer. All the gates can then be activated using a single electrical contact.

In a variant, the component can comprise electrical contact areas on each of the annular semiconductor layers. This enables the gate current to be distributed more efficiently for more efficient triggering of the component in the presence of an ESD pulse.

According to another aspect, a device for protecting two nodes of an integrated circuit against electrostatic discharges is proposed, the device comprising a component as defined above, whose two terminals are, respectively, connected to the two nodes and at least one trigger circuit connected to the at least one annular layer forming a common gate.

According to another aspect, an input/output cell of an integrated circuit is proposed. The cell comprises an input/output pad, a first power supply terminal, a second power supply terminal, and three protection devices as defined above, connected, respectively, between the input/output pad and the first power supply terminal, between the input/output pad and the second power supply terminal, and between the two power supply terminals. The protection devices are intended to protect the input/output pad, the first power supply terminal, and the second power supply terminal.

According to another aspect, an integrated circuit comprising at least one input/output cell as defined above is proposed.

BRIEF DESCRIPTION OF THE DRAWINGS

Other advantages and features of the invention will be made clear by the detailed description of embodiments which are not in any way limiting, and the attached drawings, in which.

DETAILED DESCRIPTION OF ILLUSTRATIVE EMBODIMENTS

Figure 1:
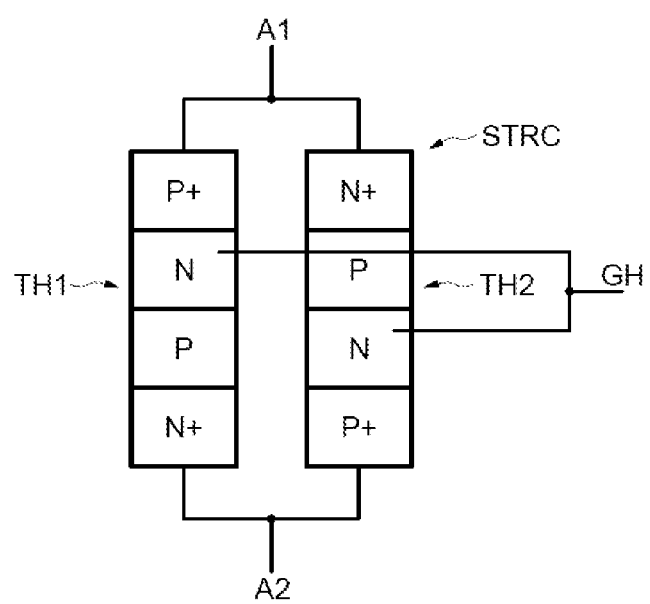
FIGS. 1 to 14, some of which are schematic, relate to different embodiments of different aspects of the invention.

In FIG. 1, the reference STRC denotes a triac structure forming, as described below, an elementary member of one embodiment of an electronic component according to the invention.

This triac structure STRC includes two thyristors TH1, TH2. In this case, the thyristor TH1 includes four semiconductor zones having, respectively, p-, n-, p- and n-type conductivity, while the thyristor TH2 includes four semiconductor zones having, respectively, n-, p-, n- and p-type conductivity.

The p+ and n+ type end semiconductor zones of the two thyristors TH1, TH2 form the two electrodes A1, A2 of the triac structure STRC.

Additionally, the other two semiconductor zones, having n-type conductivity, of the two thyristors TH1 and TH2 form a single gate GH for the triac structure.

Figure 2:
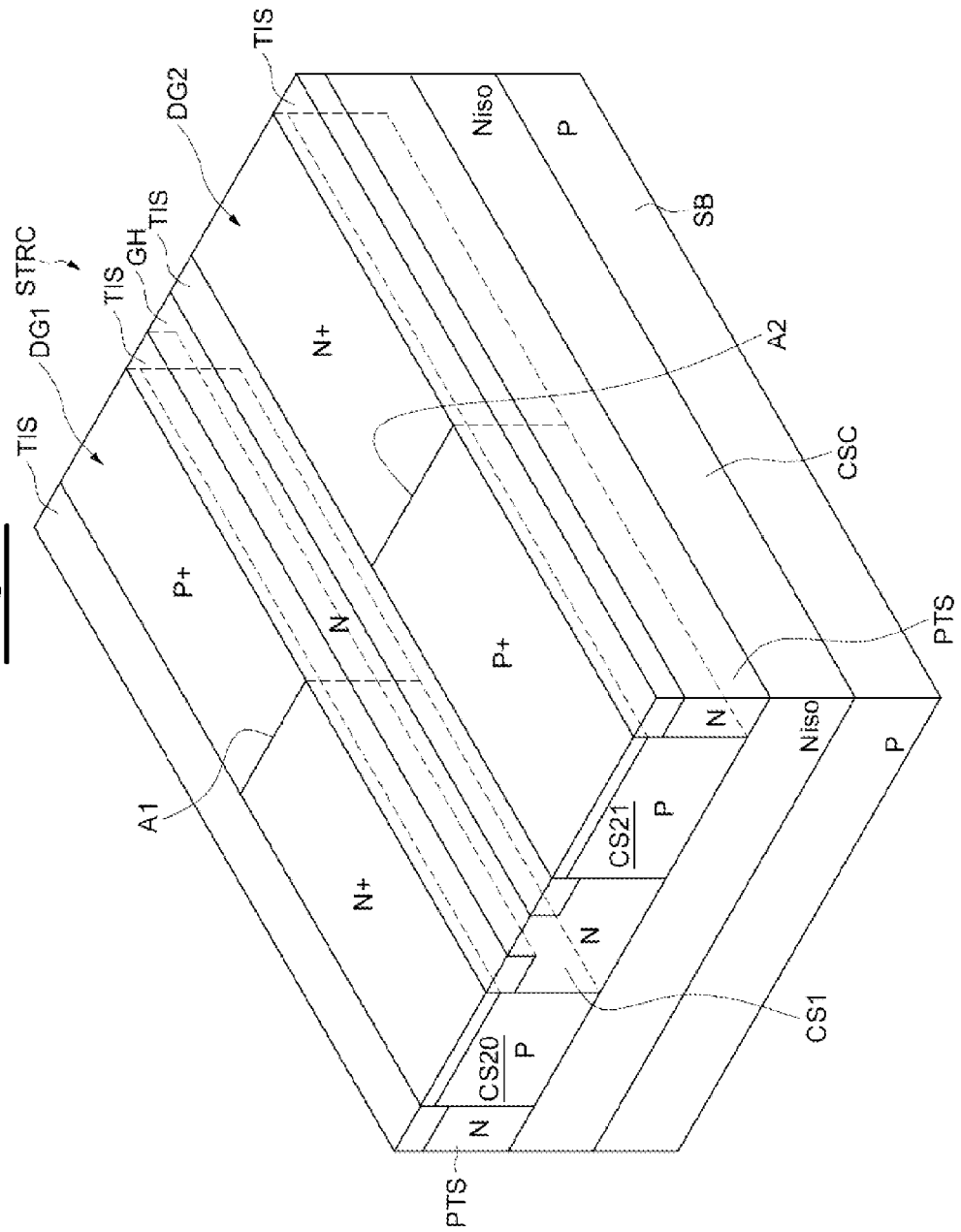

In topological terms, as shown in FIG. 2, the triac structure STRC includes, within a semiconductor substrate SB, having p-type conductivity for example, two semiconductor tanks CS20 and CS21, each having a first type of conductivity, which in this case is p-type conductivity. These two tanks CS20 and CS21 are separated by a semiconductor layer CS1 having a second type of conductivity opposed to the first, in this case n-type conductivity. The semiconductor layer CS1 forms the gate GH of the triac structure.

Additionally, an n+ doped zone and a p+ doped zone, in contact with each other, are both in contact with the tank CS20 and form the electrode A1 of the triac STRC.

Similarly, a p+ doped zone and an n+ doped zone, in contact with each other, are both in contact with the second tank CS21 and form the second electrode A2 of the triac STRC.

The p+ and n+ zones are isolated from the semiconductor layer CS1 by isolation trenches TIS, of the shallow trench isolation (STI) type.

Similarly, isolation trenches TIS isolate the n+ and p+ zones of the triac structure STRC laterally towards the outside.

Each pair of n+ and p+ zones facing each other and separated by the semiconductor layer CS1 forms, with the underlying tanks CS20 and CS21, a semi-triac (thyristor) TH1 or TH2 (FIG. 1).

Additionally, in this embodiment, an n-doped buried semiconductor layer CSC is commonly known by the term "Niso layer", and is in contact with the tanks CS20 and CS21 as well as the layer CS1.

N-doped wells PTS are positioned laterally with respect to the tanks CS20 and CS21 are in contact with the buried layer CSC.

In this case, therefore, the triac structure STRC, which is a double p-n-p-n structure, comprises two fingers DG1, DG2, separated by the layer CS1 which forms the gate of the structure.

In practice, the Niso layer, together with the layers CS1 and the wells PTS, can be formed by the implantation of n-dopants within the p-type substrate. Thus the tanks CS20 and CS21 are a non-implanted part of the p substrate. Additionally, the n+ and p+ zones are zones made by the implantation of n- or p-dopants so as to facilitate contact formation. These zones can also be silicided to facilitate electrical contact on them.

As described in detail below, the triac structure STRC of FIG. 2, and in particular the fingers DG1 and DG2, together with the layer CS1 forming the gate, form an elementary member of the component CMP. The geometry of the structure STRC within the component CMP can be of any type, for example rectilinear as shown in FIG. 2, or right-angled.

Figure 3:
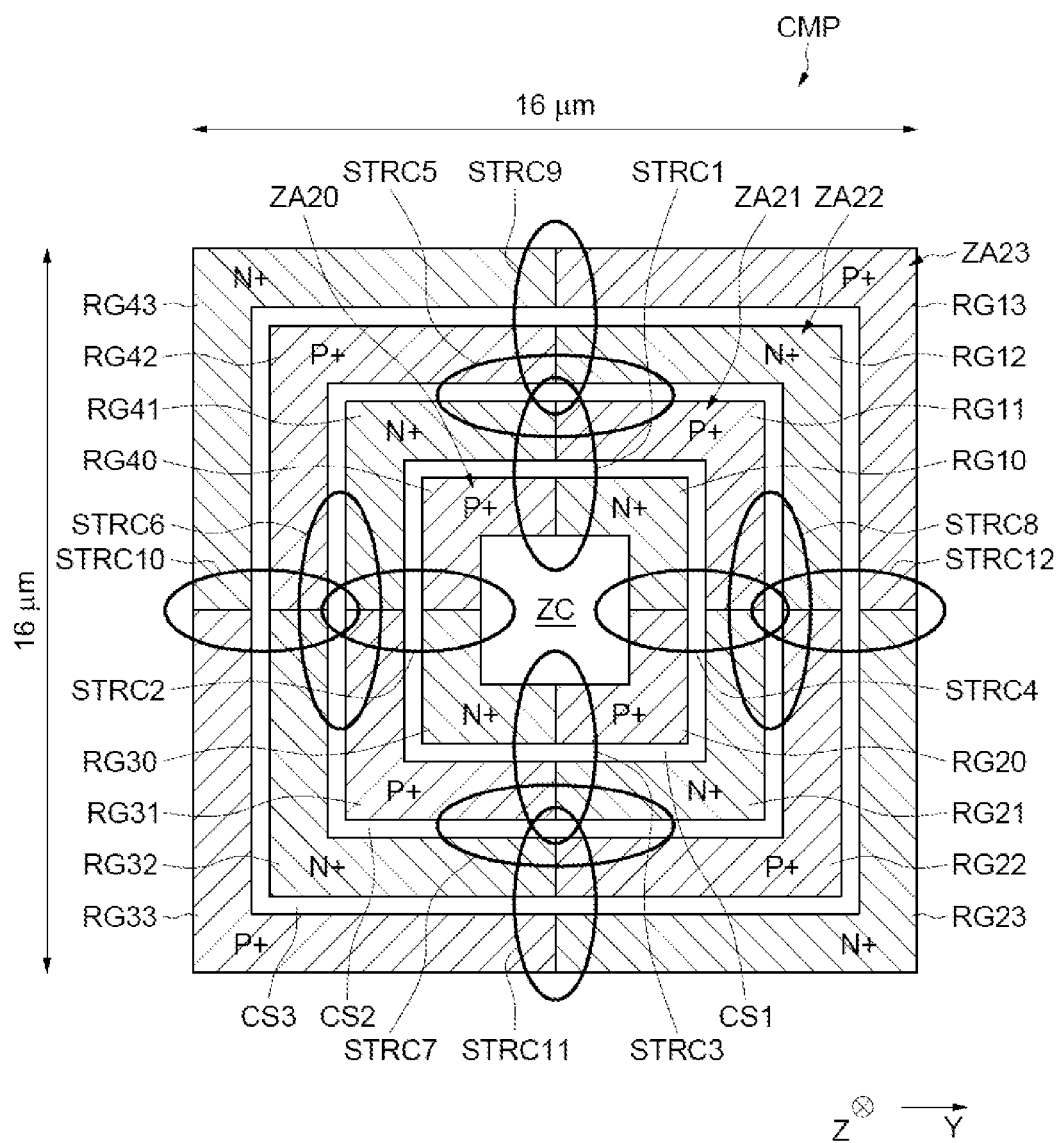
Figure 4:
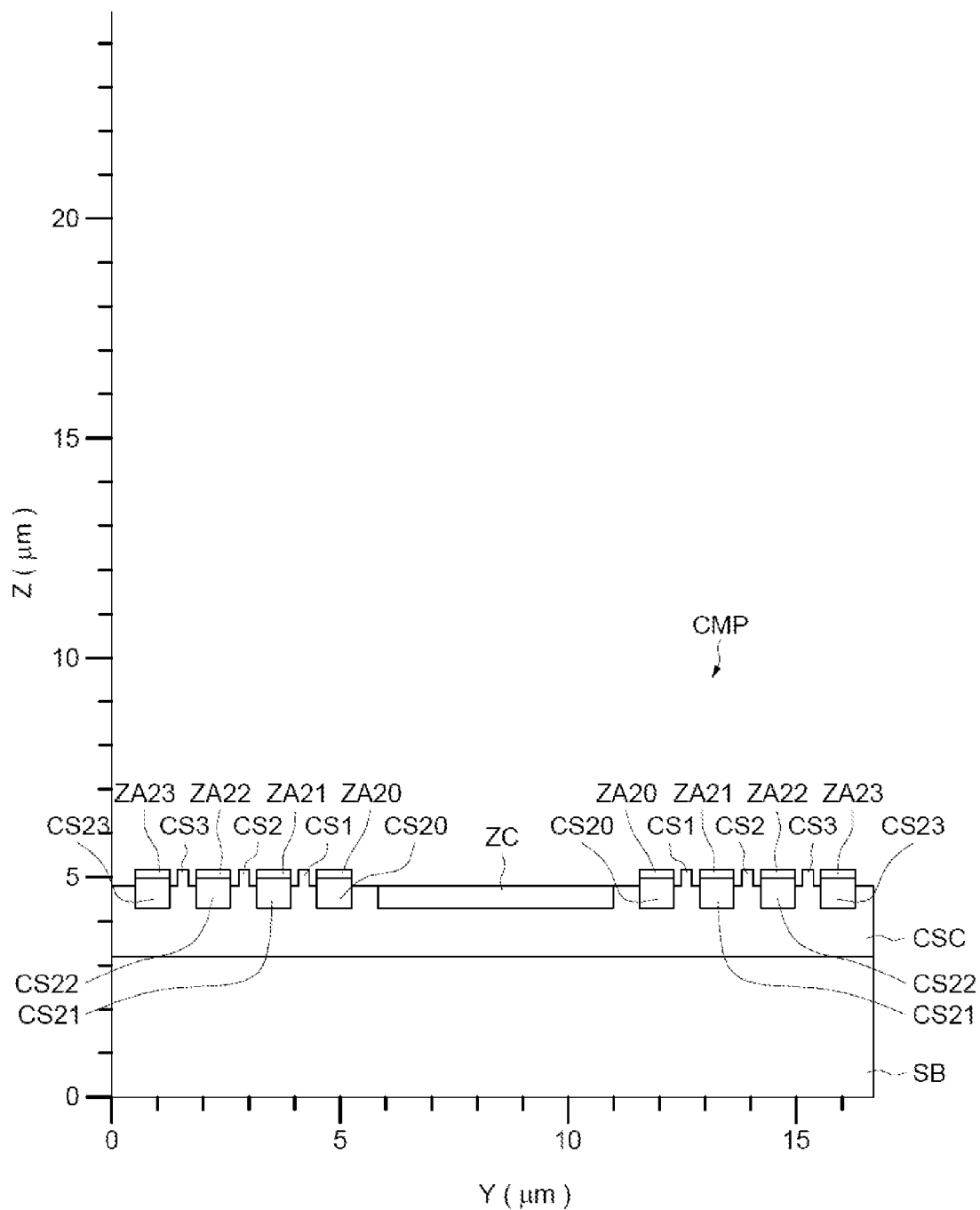

In the embodiment shown in FIG. 3 and in FIG. 4, which is a partial section through FIG. 3, the component CMP includes M (M=4) annular semiconductor tanks CS20-CS23, each having p-type conductivity in this case.

Two adjacent annular tanks are separated by an annular semiconductor layer having n-type conductivity. In the described example, the four tanks are separated from each other by three annular semiconductor layers CS1-CS3.

It should be noted that the isolating regions TIS of FIG. 2 are omitted from FIGS. 3 and 4 for the sake of simplicity.

The component also includes M (M=4) annular semiconductor zones ZA20-ZA23 covering and contacting the M (M=4) annular tanks CS20-CS23 respectively.

Each annular semiconductor zone includes a sequence of R (R=4, in this case) semiconductor regions which are in contact with each other and which are alternately of the n+ and p+ type.

More specifically, the annular zone ZA20 includes the p+ type region RG40, the n+ type region RG10, the p+ type region RG20 and the n+ type region RG30.

The annular zone ZA21 includes the n+ type region RG41, the p+ type region RG31, the n+ type region RG21 and the p+ type region RG11.

The annular zone ZA22 includes the p+ type region RG42, the n+ type region RG32, the p+ type region RG22 and the n+ type region RG12.

The annular zone ZA23 includes the n+ type region RG43, the p+ type region RG33, the n+ type region RG23 and the p+ type region RG13.

As can be seen, these regions are in contact with each other within each annular zone, and they are electrically coupled together so as to form a common annular electrode. This electrical coupling can be provided, for example, by siliciding the annular zone to enable an electrical contact area to be made on it. It is also possible to deposit an annular metal coating on each annular zone.

As a general rule, R is an even number equal to or greater than 2.

Additionally, each semiconductor region of one of the annular zones faces a semiconductor region of an adjacent annular zone, and two facing regions have the two types of conductivity, n and p, respectively.

In the example shown in FIGS. 3 and 4, the central zone ZC located inside the annular zone ZA20 is formed by part of the substrate and therefore has p-type conductivity. In a variant, as will be described subsequently, this central zone ZC could be an emerging part of the buried layer CSC having n-type conductivity.

Thus it can be seen that the component of FIGS. 3 and 4 includes, in topological terms, twelve triac structures STRC1-STRC12.

In the example shown here, the n+ doped zones have a dopant concentration of $5.10^{20}$ atoms per cm$^3$, while the p+ doped zones have a dopant concentration of the order of $10^{20}$ atoms per cm$^3$. The n-doped zones have a dopant concentration of the order of $1.7\times10^{17}$ atoms per cm$^3$, while the p-doped zones have a dopant concentration of the order of $3.5\times10^{16}$ atoms per cm$^3$.

The component of FIG. 3 takes the form of a square with a side of 16 microns, and the width of the p tanks and consequently of the annular zones is less than a micron, being of the order of 0.7 micron for example, while the width of the gates (layers CS1-CS3) is less than 0.5 micron, being of the order of 0.3 micron for example.

Figure 5:
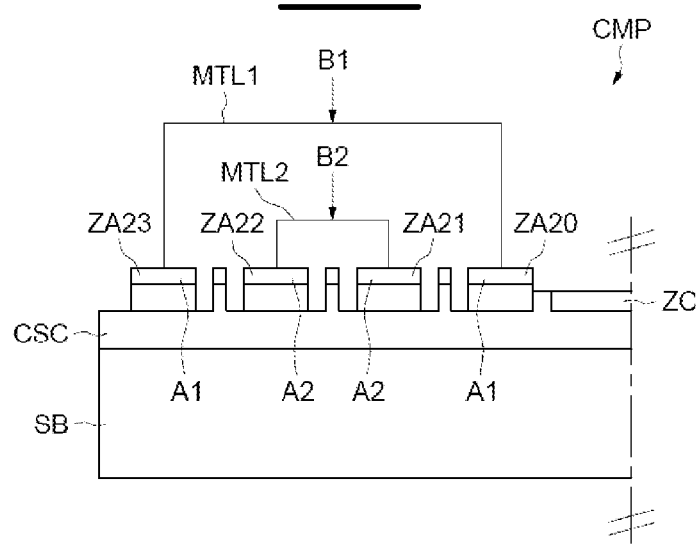

When M is greater than or equal to 4, the component further comprises, as shown in FIG. 5, a plurality of supplementary electrically conductive elements, such as metallic lines formed within at least one level of metallization of the interconnection part (Back End Of Line: BEOL) of the integrated circuit, intended to interconnect a plurality of first annular electrodes A1 of the triac structures and to interconnect a plurality of second annular electrodes A2 of these triac structures.

The first terminal B1 of the component CMP is then formed by these electrodes A1 connected together, while the second terminal B2 of the component is formed by the electrodes A2 connected together.

There are various possible ways of connecting the annular electrodes together.

Thus, in the example shown in FIG. 5, it is considered that the annular zones ZA20 and ZA23 form the first electrodes A1 of the corresponding triac structures and that they are connected together.

Similarly, in this example it is considered that the annular zones ZA21 and ZA22 form the second annular electrodes A2 of the corresponding triac structures, and that they are connected together.

There are also a number of possible ways of connecting the various gates GH.

Figure 6:
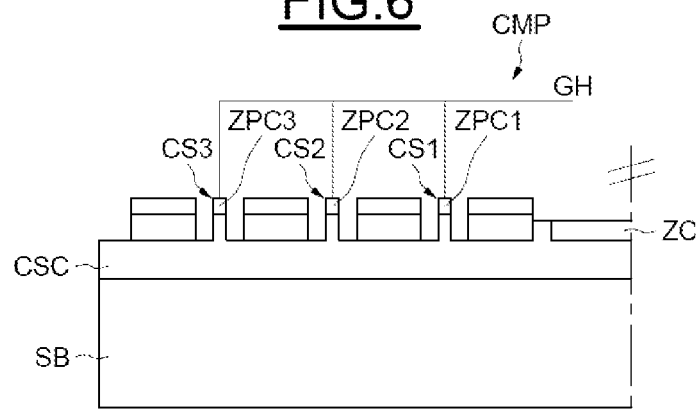

A first possible method, as shown in FIG. 6, is to silicide the ends of the layers CS1-CS3 and to form electrical contact areas ZPC1-ZPC3 on these silicided zones. The corresponding electrical contacts are then, for example, connected together to form a metal coating of the gate GH which will be connected to a trigger circuit.

Figure 7:
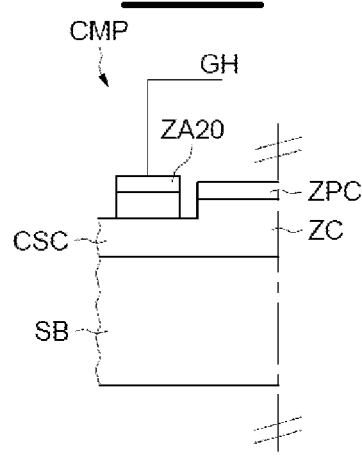

Another possible method, as shown in FIG. 7, is to use the emerging part of the buried layer CSC, if present, to provide a contact area ZPC on this emerging part ZC, enabling all the gates to be triggered equally and simultaneously, since all the layers CS1-CS3 are connected to the buried layer CSC.

Consequently, although the variant of FIG. 7 is simpler to construct, that of FIG. 6 provides more effective triggering, because the gate current is distributed directly among the gates in question.

Clearly, these two variants could be combined; in other words, contact areas could be provided simultaneously on the layers CS1, CS2, CS3, together with a contact area on the central zone.

Figure 8:
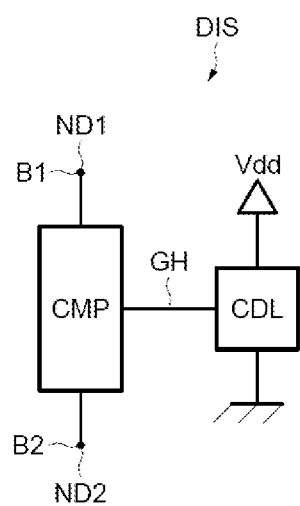

The component CMP can be used, as shown in FIG. 8, to protect two nodes of an integrated circuit ND1, ND2 against ESD pulses. In this context, the corresponding protection device includes the component CMP whose two terminals B1 and B2 are respectively connected to the two nodes ND1 and ND2 to be protected, together with a circuit CDL, of the type known to those skilled in the art as a "trigger circuit", connected between two power supply rails and also connected to the gate GH of the component CMP.

Any known structure of the trigger circuit CDL may be suitable, for example one or more NMOS transistors having their grids and substrates connected to ground (known as grounded gated NMOS or GGNMOS), or a trigger circuit of the type described in patent application WO 2011/089179.

The behavior of a component CMP of the type shown in FIGS. 3, 4 and 5 will now be described, with more specific reference to FIGS. 9 and 10, in the presence of a positive ESD pulse (FIG. 9) and a negative ESD pulse (FIG. 10) applied between the two nodes ND1 and ND2 (terminals B1 and B2 of the component).

Figure 9:
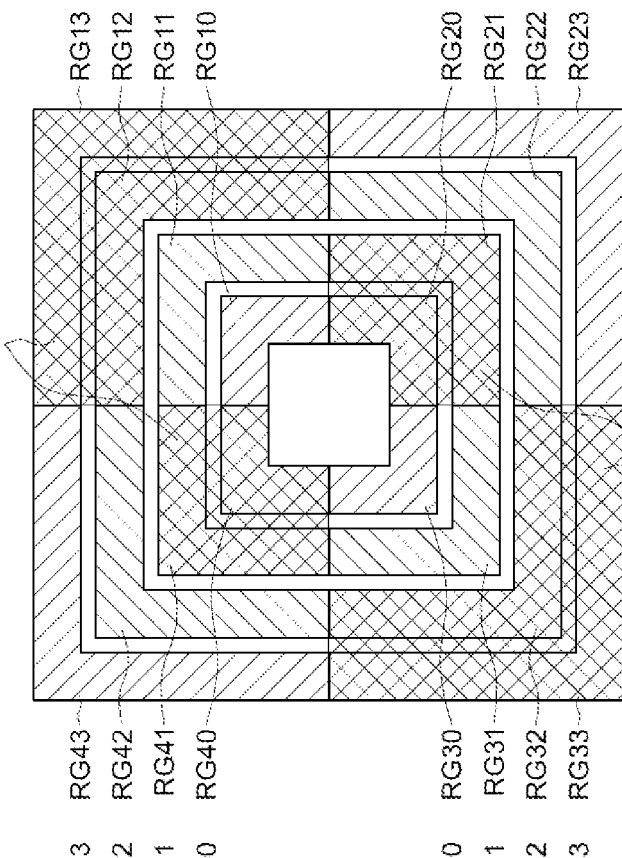
Figure 10:
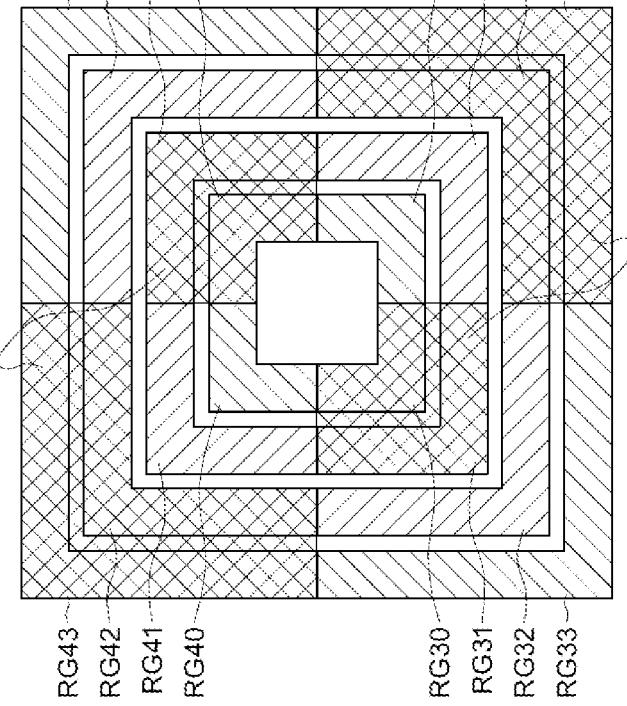

In the presence of a positive ESD pulse, in other words an ESD pulse travelling from the electrodes A1 towards the electrodes A2, in other words from the terminal B1 to the terminal B2, the sectors which dissipate the energy are, as shown in FIG. 9, the sectors RG43 and RG42, RG22 and RG23, RG30 and RG31, and RG10 and RG11. This is because, in the case of a positive ESD pulse, the current is propagated from the p+ to the n+ region. Therefore only some thyristors conduct, while others are switched off.

In the case of a negative ESD pulse (FIG. 10), in other words a pulse travelling from the electrodes A2 towards the electrodes A1, the energy dissipating sectors are the sectors RG12, RG13, RG40 and RG41, RG20 and RG21, and RG32 and RG33.

Clearly, if the electrodes A1 of the component CMP were those formed by the outer annular zone ZA23 and by the annular zone ZA21, and if the electrodes A2 were those formed by the annular zones ZA22 and ZA20, then, in the case of a positive ESD pulse, the energy dissipation sectors would be the sectors RG40 to RG43 and RG20 to RG23. In the case of a negative ESD pulse, the energy dissipation sectors would be the sectors RG10 to RG13 and RG30 to RG33.

It can be seen, therefore, that it is preferable, in applications requiring high energy dissipation, to use the configuration of FIG. 5, in which two adjacent annular zones form a single electrode and are framed by two annular zones forming the other electrode. This is because the energy dissipating sectors are then bordered by "cold" sectors, in other words those which do not conduct any of the pulse current. This makes the component more robust in relation to the energy dissipation in the presence of an ESD pulse.

Figure 11:
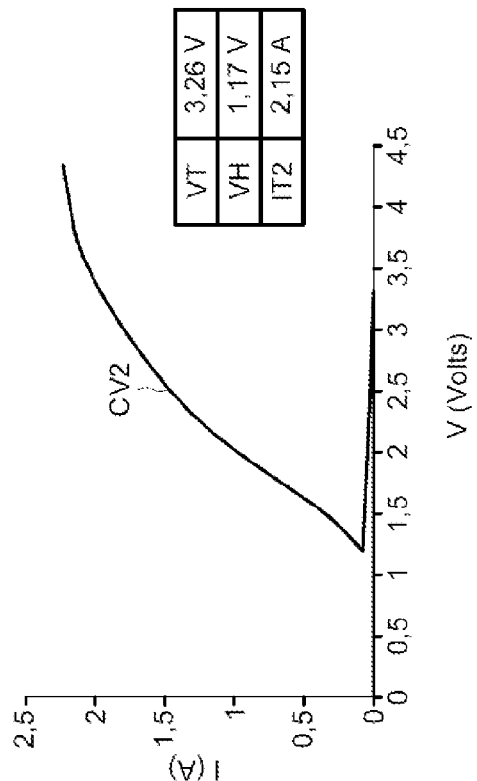
Figure 12:
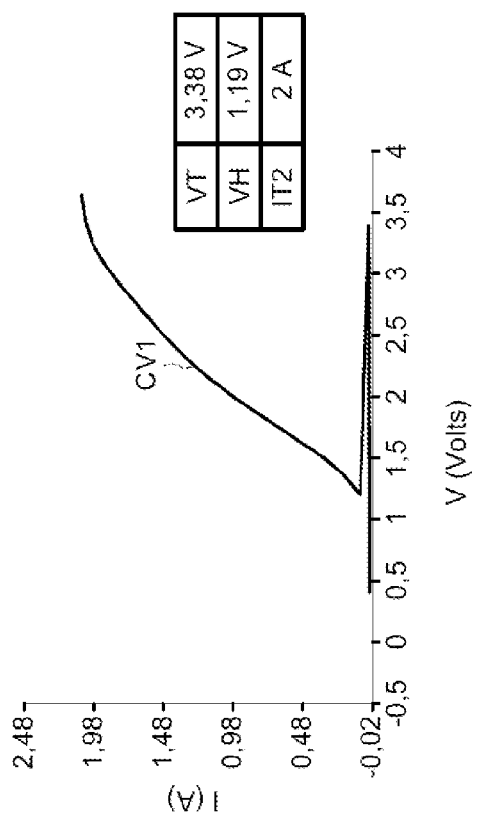

Measurements have been made on the component of FIGS. 3, 4 and 5, and have been used to plot curves CV1 (FIG. 11) and CV2 (FIG. 12) which show the variation of the current I flowing across the component as a function of the voltage V at its terminals, for a positive ESD pulse (FIG. 11) and for a negative ESD pulse (FIG. 12).

It can be seen, therefore, that, in the case of a positive ESD pulse, the trigger voltage VT of the component is equal to 3.36 volts, while the holding voltage VH is equal to 1.19 volts.

In the case of a negative ESD pulse, the trigger voltage is equal to 3.26 volts, while the holding voltage is equal to 1.17 volts.

Additionally, the maximum value IT2 of the current that can flow through the component is equal to 2 amperes in a positive ESD pulse, and 2.15 amperes in a negative ESD pulse.

These maximum values correspond to an electrostatic discharge of 3.6 kV HBM.

The component CMP can therefore easily absorb electrostatic discharges of 3 kV HBM, while having a parasitic capacitance of 100 femtofarads.

Clearly, the component CMP can, in a very simple case, include only two annular zones, each of which then corresponds to one of these two electrodes. In this case the resulting component CMP has an annular topology of triac structures within which the number R of triac structures can be adjusted.

Although the number R is even, the number M of p-type semiconductor tanks, which is also the number of annular zones, is not necessarily even. It may in fact be odd. For example, the component CMP could include three annular zones with the two end annular zones connected together by a metal coating so as to form a first electrode of the component, and the annular zone positioned between the two end annular zones would then form the second electrode of the component.

The component according to the different embodiments of the invention not only has a greatly reduced surface occupation and parasitic capacitance, but is also fully compatible with CMOS or BICMOS manufacturing methods. It can be constructed by all types of technology, such as the solid substrate or SOI (Silicon On Insulator) substrate type.

Finally, the modular form of the component makes it adaptable to all types of ESD pulse, regardless of the power of these pulses.

It is simply necessary to adjust the number of triac structures by varying the numbers R and/or M.

It is particularly useful to incorporate devices for protection against electrostatic discharges of the type described above in an input/output cell of an integrated circuit.

Figure 13:
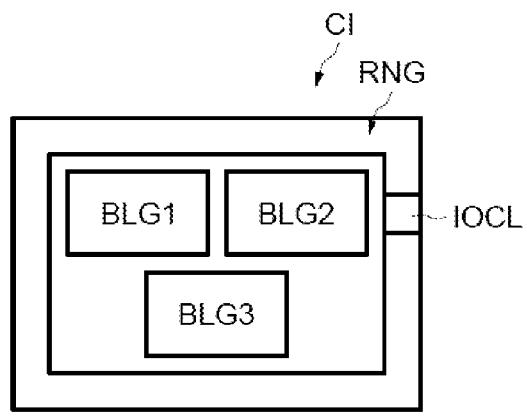

By way of non-limiting example, input/output cells IOCL of this type can be positioned, as shown in FIG. 13, within a ring RNG at the periphery of the integrated circuit CI.

These cells IOCL can, for example, allow the passage of supply voltages and/or data signals to and/or from functional blocks BLG1-BLG3 of the integrated circuit.

Figure 14:
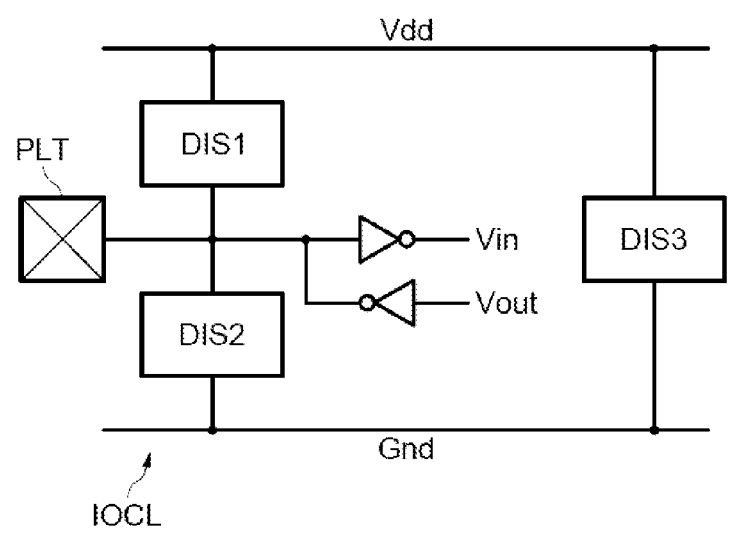

As shown in FIG. 14, the input/output cell comprises, for example, an input-output pad PLT for receiving and/or transmitting a signal. This cell includes two power supply terminals Vdd and Gnd. A first device DIS1 of the type described above is then provided between the power supply terminal Vdd and the input-output pad PLT.

A second protection element DIS2 is provided between the input-output pad PL2 and the second power supply terminal Gnd. Finally, a third ESD protection device DIS3 is provided between the two power supply terminals Vdd and Gnd.

Thus an input-output cell of this type is protected in an extremely simple manner against an electrostatic discharge occurring between the two power supply terminals Vdd and Gnd, and also against any electrostatic discharge which may occur either between the power supply terminal Vdd and the input-output pad or between the input-output pad and the power supply terminal Gnd. The functional blocks connected between the two terminals Vdd and Gnd are therefore also protected against an electrostatic discharge.

What is claimed is:

1. An integrated electronic component, comprising:
M concentric annular semiconductor tanks, each tank having a first type of conductivity, where M is greater than or equal to two;
two adjacent annular casings being separated by an annular semiconductor layer having a second type of conductivity opposite the first type of conductivity,
M annular semiconductor zones, each annular semiconductor zone covering and contacting a respective one of the M annular tanks and each annular semiconductor zone including a sequence of R semiconductor regions in contact with each other, the semiconductor regions having the first and second types of conductivity alternately and being electrically coupled to each other so as to form a common annular electrode, where R is an even number greater than or equal to two, wherein each semiconductor region of one of the annular zones faces a semiconductor region of an adjacent annular zone such that two facing regions each have a different one of the first and second types of conductivity, wherein two adjacent annular casings separated by the annular layer and their two associated annular zones form R triac structures in parallel having a single common gate formed by the annular layer;
a first terminal of the component being formed by at least a first annular electrode; and
a second terminal of the component being formed by at least a second annular electrode.

2. The component according to claim 1, wherein M is greater than or equal to three, the component further comprising at least one supplementary electrically conductive element, at least one of the first and second terminals being formed by at least two annular electrodes interconnected by the at least one supplementary element.

3. The component according to claim 2, wherein M is greater than or equal to four and wherein the at least one supplementary electrically conductive element comprises a plurality of supplementary electrically conductive elements, the first terminal being formed by a plurality of first annular electrodes interconnected by at least a first supplementary element, while the second terminal is formed by a plurality of second annular electrodes interconnected by at least a second supplementary element.

4. The component according to claim 3, wherein the first terminal is at least formed by two adjacent annular electrodes and the second terminal is at least formed by two annular electrodes framing the two adjacent electrodes.

5. The component according to claim 1, further comprising a buried semiconductor layer having the second type of conductivity and contacting all the annular semiconductor layers.

6. The component according to claim 5, wherein the buried layer emerges inside a central annular tank and an electrical contact area is provided on an emerging part of the buried layer.

7. The component according to claim 1, comprising electrical contact areas on each of the annular semiconductor layers.

8. A device for protecting two nodes of an integrated circuit against electrostatic discharges, the device comprising the component according to claim 1, wherein the first and second terminals are respectively connected to the two nodes and at least one trigger circuit connected to at least one annular layer forms a common gate.

9. An integrated circuit, comprising:
an input/output pad;
a first power supply terminal;
a second power supply terminal; and
a device according to claim 8, coupled between the input/output pad and the first power supply terminal.

10. The integrated circuit according to claim 9, further comprising a second device coupled between the input/output pad and the second power supply terminal, the second device having a structure similar to the device.

11. The integrated circuit according to claim 10, further comprising a third device coupled between the first power supply terminal and the second power supply terminal, the third device having a structure similar to the device.

12. The integrated circuit according to claim 11, wherein the device, the second device and the third device protect the input/output pad, the first power supply terminal, and the second power supply terminal against electrostatic discharges.

13. An integrated circuit comprising:
M concentric annular semiconductor tanks, each tank having a first type of conductivity, where M is greater than or equal to three;
two adjacent annular casings being separated by an annular semiconductor layer having a second type of conductivity opposite the first type of conductivity,
M annular semiconductor zones, each annular semiconductor zone covering and contacting a respective one of the M annular tanks and each annular semiconductor zone including a sequence of R semiconductor regions in contact with each other, the semiconductor regions having the first and second types of conductivity alternately and being electrically coupled to each other so as to form a common annular electrode, where R is an even number greater than or equal to two, wherein each semiconductor region of one of the annular zones faces a semiconductor region of an adjacent annular zone such that two facing regions each have a different one of the first and second types of conductivity, wherein two adjacent annular casings separated by the annular layer and their two associated annular zones form R triac structures in parallel having a single common gate formed by the annular layer;
a first terminal formed by at least a first annular electrode;
a second terminal formed by at least a second annular electrode;
at least one supplementary electrically conductive element, at least one of the first and second terminals being formed by at least two annular electrodes interconnected by the at least one supplementary element; and
at least one trigger circuit coupled to at least one annular layer to form a common gate.

14. The integrated circuit according to claim 13, wherein the first terminal is coupled to a first node and the second terminal is coupled to a second node so that the first and second nodes are protected against electrostatic discharges.

15. The integrated circuit according to claim 13, wherein M is greater than or equal to four and wherein the at least one supplementary electrically conductive element comprises a plurality of supplementary electrically conductive elements, the first terminal being formed by a plurality of first annular electrodes interconnected by at least a first supplementary element, while the second terminal is formed by a plurality of second annular electrodes interconnected by at least a second supplementary element.

16. The integrated circuit according to claim 15, wherein the first terminal is at least formed by two adjacent annular electrodes and the second terminal is at least formed by two annular electrodes framing the two adjacent electrodes.

17. The integrated circuit according to claim 13, further comprising a buried semiconductor layer having the second type of conductivity and contacting all the annular semiconductor layers.

18. The integrated circuit according to claim 17, wherein the buried layer emerges inside a central annular tank and an electrical contact area is provided on an emerging part of the buried layer.

19. The integrated circuit according to claim 13, comprising electrical contact areas on each of the annular semiconductor layers.

20. An integrated electronic, comprising:
M concentric annular semiconductor tanks, each tank having a first type of conductivity, where M is greater than or equal to two;
two adjacent annular casings being separated by an annular semiconductor layer having a second type of conductivity opposite the first type of conductivity,
M annular semiconductor zones, each annular semiconductor zone covering and contacting a respective one of the M annular tanks and each annular semiconductor zone including a sequence of R semiconductor regions in contact with each other, the semiconductor regions having the first and second types of conductivity alternately and being electrically coupled to each other so as to form a common annular electrode, where R is an even number greater than or equal to two, wherein each semiconductor region of one of the annular zones faces a semiconductor region of an adjacent annular zone such that two facing regions each have a different one of the first and second types of conductivity, wherein two adjacent annular casings separated by the annular layer and their two associated annular zones form R triac structures in parallel having a single common gate formed by the annular layer;
a buried semiconductor layer having the second type of conductivity and contacting all the annular semiconductor layers;
electrical contact areas on each of the annular semiconductor layers;
a first terminal formed by at least a first annular electrode; and
a second terminal formed by at least a second annular electrode.

* * * * *